US007014478B2

(12) United States Patent
Yamashita et al.

(10) Patent No.: US 7,014,478 B2
(45) Date of Patent: Mar. 21, 2006

(54) ELECTRICAL CONNECTION BOX AND MANUFACTURING METHOD THEREOF

(75) Inventors: Kouji Yamashita, Mie (JP); Kouzou Kimura, Mie (JP); Takayuki Tomita, Mie (JP); Shigeki Yamane, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/131,423

(22) Filed: May 18, 2005

(65) Prior Publication Data

US 2005/0257950 A1    Nov. 24, 2005

(30) Foreign Application Priority Data

May 21, 2004 (JP) .............................. 2004-151618
Dec. 24, 2004 (JP) .............................. 2004-374268

(51) Int. Cl.
*H01R 12/00* (2006.01)
(52) U.S. Cl. ...................... 439/76.2; 439/949; 439/936
(58) Field of Classification Search ............... 439/76.2, 439/936, 949
See application file for complete search history.

(56) References Cited

U.S. PATENT DOCUMENTS

| 6,761,567 | B1 * | 7/2004 | Onizuka et al. ........... 439/76.2 |
| 6,835,090 | B1 * | 12/2004 | Liedtke ...................... 439/521 |
| 2002/0025699 | A1 * | 2/2002 | Oka et al. .................. 439/76.2 |
| 2005/0233617 | A1 * | 10/2005 | Yamashita ................. 439/76.2 |
| 2005/0233618 | A1 * | 10/2005 | Yamashita ................. 439/76.2 |

FOREIGN PATENT DOCUMENTS

JP    A-2003-164039    6/2003

* cited by examiner

*Primary Examiner*—Ross Gushi
(74) *Attorney, Agent, or Firm*—Oliff & Berridge, PLC.

(57) ABSTRACT

An electrical connection box includes a housing having a bottom plane with a recessed part at which the bottom plane is at least partially depressed; a circuit substrate accommodated into the housing to be overlapped on the bottom plane, the circuit substrate having a hole connectable to an inside of the recessed part of the housing and a space above the circuit substrate; and a potting material filled so that the circuit substrate can be buried into the housing. The hole is formed at a position corresponding to the recessed part of the housing.

9 Claims, 11 Drawing Sheets

ELECTRICAL CONNECTION BOX AND MANUFACTURING METHOD THEREOF

BACKGROUND OF THE INVENTION

1. Field of the Invention

The present invention relates to an electrical connection box in which a circuit substrate is accommodated into a housing and the manufacturing method thereof.

2. Description of the Related Art

As disclosed in JP-A-2003-164039 as this type of an electrical connection box, such an electrical connection box is known, that is provided with a circuit substrate, switching elements arrayed on the front plane of the circuit substrate and conductive channels of electric power arrayed along the back plane of the circuit substrate and connected to an electric source.

In the above-described electrical connection box, for the purpose of effectively transmitting the heat generated at the circuit substrate inside the container-like housing to the housing and also retaining the insulating property, the circuit substrate is accommodated in such a way that conductive channels of electric power arrayed at the back plane of the circuit substrate are not brought into contact with the bottom plane of the housing but are overlapped with each other over a wide area. Then, the potting material is filled in such a way that the circuit substrate can be buried into the housing, thereby making it possible to keep the circuit substrate more waterproof and insulative. In addition, potting is a process in which liquid potting materials (synthetic resin forming materials such as epoxy resin, urethane resin and silicone) are injected and thereafter allowed to cure.

SUMMARY OF THE INVENTION

In the above-described electrical connection box in which, for example, a terminal fitting is provided vertically to penetrate through a circuit substrate, it has been designed so that a housing is partially depressed to form a recessed part for the purpose of preventing possible interference of the housing with the lower edge of the terminal fitting projected from the circuit substrate. Filling a potting material into the recessed part as well makes it possible to prevent water from entering into the recessed part and also prevents possible leakage of electric current between adjacent terminal fittings.

However, in the above constitution, since the circuit substrate is accommodated so as to be overlapped with the bottom plane of the housing, the potting material is injected into the recessed part only through a slight clearance developed, for example, between the circuit substrate and the housing. Therefore, there is a case where the potting material is not filled into the recessed part in a sufficient quantity to result in development of an air residue. A subsequent cure of the potting material may develop a clearance at which potting material is not filled inside the recessed part due to the air residue. In this instance, water enters into the thus developed clearance, thereby causing leakage of electric current between adjacent terminal fittings to affect the reliability, which was the problem.

The present invention has been made, with the above circumstances taken into account, and is to provide an electrical connection box for which the waterproof property and the reliability are secured.

According to one aspect of the invention, there is provided with an electrical connection box including: a housing having a bottom plane with a recessed part at which the bottom plane is at least partially depressed; a circuit substrate accommodated into the housing to be overlapped on the bottom plane, the circuit substrate having a hole connectable to an inside of the recessed part of the housing and a space above the circuit substrate; and a potting material filled so that the circuit substrate can be buried into the housing. The hole is formed at a position corresponding to the recessed part of the housing.

According to another aspect of the invention, The hole is a potting material inflow hole.

By thus configuration, the potting material can be injected from the potting material inflow hole connected communicatively to the inside of the recessed part and a space above the circuit substrate in a sufficient quantity to fill the potting material into the recessed part, thereby preventing possible development of an air residue inside the recessed part. Therefore, water is prevented from entering into a clearance developed from the air residue to improve the waterproof property. Short circuits which may be caused by water entered or dew drops are also prevented to improve the reliability.

According to another aspect of the invention, the hole is an air exhaust hole.

By thus configuration, air pushed by the potting material can escape from an air exhaust hole according to filling of the potting material into the recessed part. Therefore, an air residue is prevented from developing throughout inside the recessed part. As a result, water is prevented from entering into the clearance developed inside the recessed part to improve the waterproof property. Short circuits which may be caused by water entered or dew drops are also prevented to improve the reliability.

According to another aspect of the invention, a tubular part opened at a position higher than an upper plane of the potting material which is filled into the housing is connected to the air exhaust hole.

By thus configuration, since an opening edge of the tubular part is opened at a position higher than the upper plane of the potting material that is filled, the inside of the recessed part is connected constantly and communicatively to the space higher than the upper plane of the potting material while the potting material is being filled and after the potting material is filled. Therefore, the potting material advances onto the upper plane of the circuit substrate while the potting material is filled into the recessed part, and even in a case where an exhaust hole is closed up before the potting material is filled into the recessed part, air pushed by the potting material can escape from the tubular part. Thus, development of the air residue inside the recessed part is more effectively prevented.

According to another aspect of the invention, an air exhaust hole connectable to the inside of the recessed part and a space above the circuit substrate is formed at a position corresponding to the recessed part on the circuit substrate.

By thus configuration, the potting material can be injected into the recessed part from the potting material inflow hole at the same time while air inside the recessed part is allowed to escape from the air exhaust hole. Therefore, the potting material can be filled into the recessed part quickly to improve the filling work efficiency of the potting material.

According to another aspect of the invention, a tubular part opened at a position higher than an upper plane of the potting material which is filled into the housing is communicatively connected to the air exhaust hole.

By thus configuration, since an opening edge of the tubular part is opened at a position higher than the upper plane of the potting material that is filled, the inside of the recessed part is connected constantly and communicatively to the space higher than the upper plane of the potting material while the potting material is being filled and after the potting material is filled. Therefore, the potting material advances onto the upper plane of the circuit substrate while the potting material is filled into the recessed part, and even in a case where an exhaust hole is closed up before the potting material is filled into the recessed part, air pushed by the potting material can escape from the tubular part. Thus, development of the air residue inside the recessed part is more effectively prevented.

According to another aspect of the invention, the air exhaust hole is provided at a position furthermost from the potting material inflow hole at a position corresponding to the recessed part.

By thus configuration, the potting material injected into the recessed part from the potting material inflow hole is filled into the recessed part, with air inside the recessed part being pushed. Air is pushed by the potting material to a place which is apart from the potting material inflow hole. Since an air exhaust hole is formed at a position which is furthermost from the potting material inflow hole, air pushed by the potting material will not remain inside the recessed part but can escape from the air exhaust hole. As a result, the potting material can be filled into the recessed part without developing any clearance, thereby preventing water from entering into the clearance to improve the waterproof property. Short circuits which may be caused by water entered or dew drops are also prevented to improve the reliability.

According to another aspect of the invention, there is provided with a method for manufacturing an electrical connection box according to the above-aspects of the invention, including: inserting an injection nozzle of the potting material into the potting material inflow hole; and filing the potting material into the recessed part.

By thus method, the potting material can be directly fed into the recessed part, with pressure given from an injection nozzle. Therefore, the potting material can be filled reliably into the recessed part.

According to another aspect of the invention, there is provided with the method for manufacturing an electrical connection box according to the above-aspects, further including: filling the potting material into the recessed part; removing the injection nozzle from the potting material inflow hole; feeding the potting material from the injection nozzle into the housing; and burring the circuit substrate into the potting material.

By thus method, an injection nozzle is used to fill the potting material into the recessed part, and also the potting material can be filled so that the circuit substrate can be buried into the housing. Therefore, the potting material can be filled in an effective way.

DESCRIPTION OF THE PREFERRED EMBODIMENTS

<Embodiment 1>

Embodiment 1 of the present invention will be described by referring to FIG. 1 through FIG. 7. In the electrical connection box 40 of the present embodiment, a circuit configuration 10 is accommodated into a housing 20 having a radiation function and a metal radiator plate 22 and the circuit configuration 10 of the housing 20 are connected while they are kept electrically insulative (refer to FIG. 1). In providing a description about this embodiment, the vertical direction is based on the vertical direction shown in FIG. 4, the longitudinal direction is based on the longitudinal direction shown in FIG. 3, and the front and the rear are regarded respectively as the left side and the right side in FIG. 4.

Figure 1:
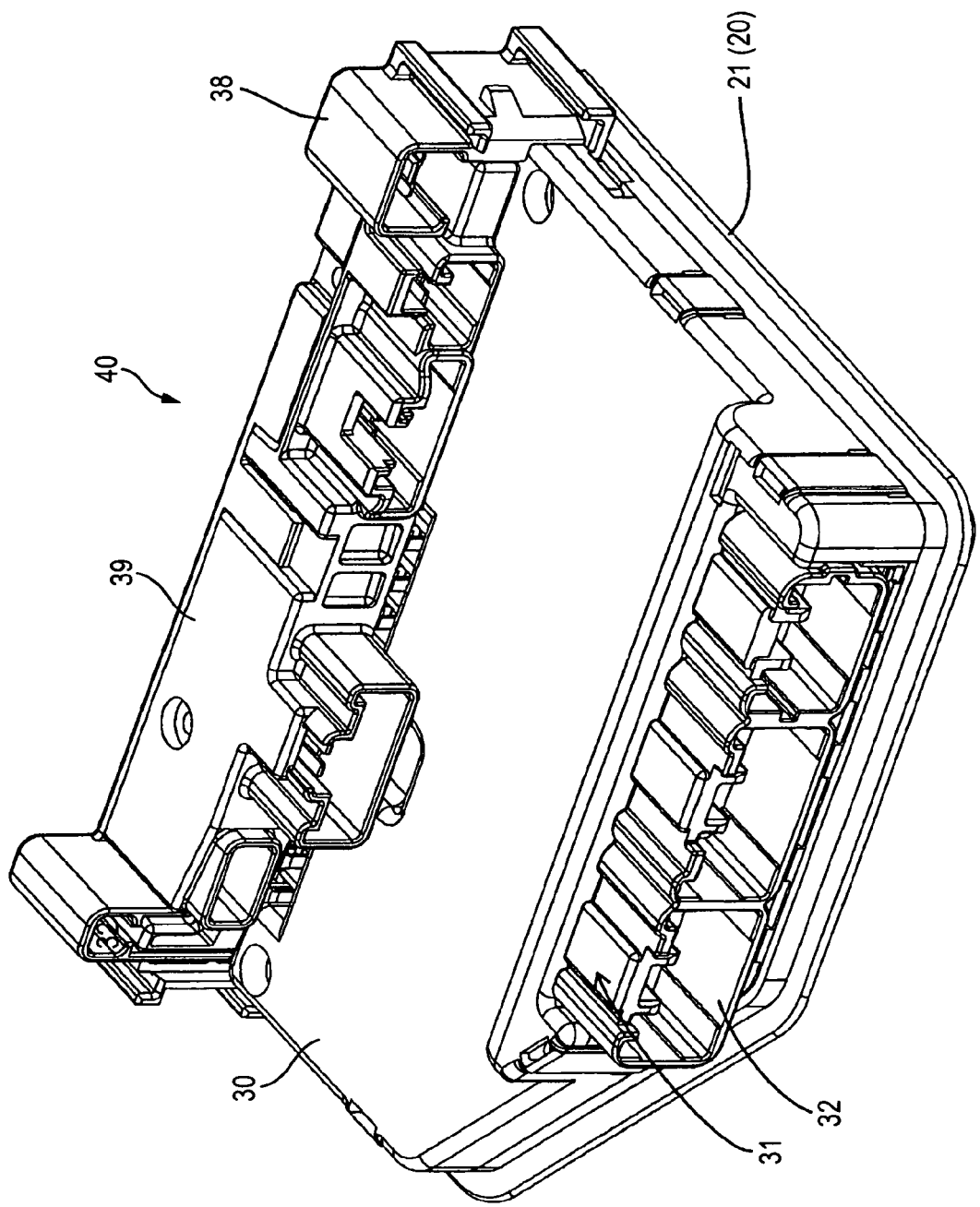
FIG. 1 is a perspective view of the electrical connection box related to Embodiment 1 of the present invention.
Figure 2:
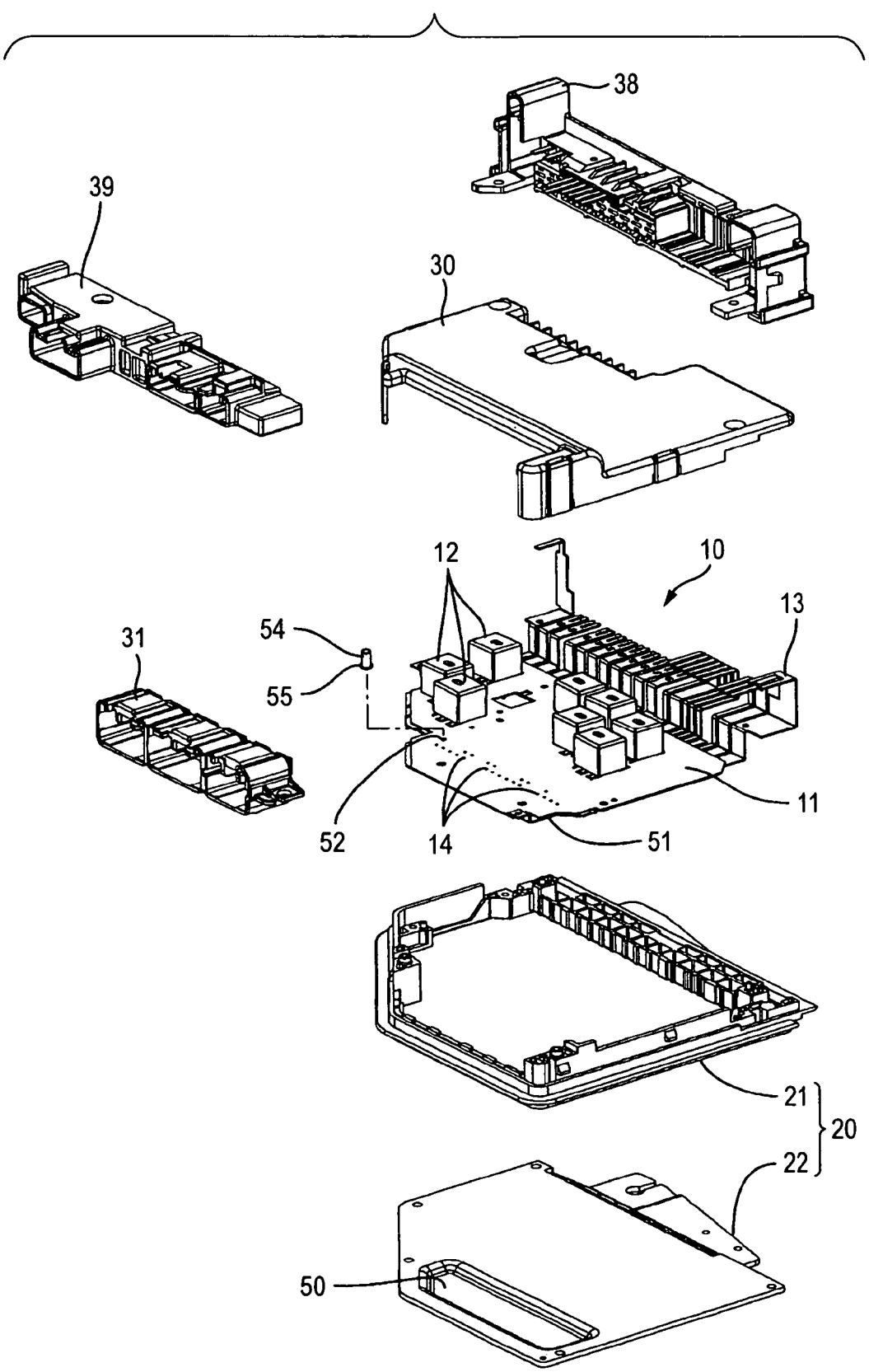
FIG. 2 is an exploded perspective view of the electrical connection box.

As shown in FIG. 2, the circuit configuration 10 is constituted with a circuit substrate 11, electronic components 12 (for example, switching members such as a mechanical relay switch and semi-conductor switching element or controlling elements) packaged into a circuit pattern (not illustrated) formed on one plane (upper plane) of the circuit substrate 11 and a metal plate-made bus bar 13 (conductive channel of electric power) arrayed along the other plane (lower plane) of the circuit substrate 11 and connected to an electric source (not illustrated).

The circuit substrate 11 and the bus bar 13 are joined in an integrated form through a thin adhesive sheet having the insulating property (not illustrated). The circuit substrate 11 and the bus bar 13 are joined in a step before the electronic components 12 are packaged. At this time, since the electronic components 12 are not packaged on the circuit substrate 11, a pressing machine or others are used to give a uniform pressing to substantially the entire front plane area of the circuit substrate 11, thereby making it possible to solidly adhere the adhesive sheet (not illustrated) to the lower plane (back plane) of the circuit substrate 11 and to the upper plane (front plane) of the bus bar 13. Thus, the circuit substrate 11 and the bus bar 13 are solidly joined by such whole area pressing.

After the circuit substrate 11 is joined with the bus bar 13, the electronic components 12 are subjected to re-flow soldering, by which the electronic components 12 are packaged into the control circuit (not illustrated) of the circuit substrate 11. In the re-flow soldering, solder is applied in advance to a position where the electronic components 12 on the control circuit (not illustrated) are installed, the electronic components 12 are placed on the solder, the solder is melted by a high-temperature furnace and cooled, by which the electronic components 12 are soldered on the control circuit (not illustrated).

The housing 20 is constituted with a synthetic resin-made frame 21 and a metal-made (for example, aluminum alloy) radiator plate 22 which is high in heat conductivity. The frame 21 is shaped along the contour of the circuit substrate 11, encircling the circuit substrate 11 over an entire circumference continuously and in a seamless manner. The radiator plate 22 is shaped approximately along the contour of the frame 21 and assembled from the lower plane to the frame 21. Assembling is done so that the lower plane of the frame 21 is brought into contact with the upper plane of the radiator plate 22 and a screw (not illustrated) penetrated through the radiator plate 22 from below is screwed to tighten the lower plane of the frame 21, by which the frame 21 is joined with the radiator plate 22 in an integrated form to constitute the housing 20. Inside the housing 20, an accommodating space 23 opened on the upper plane side is formed with the radiator plate 22 and the frame 21 erecting along an outer circumference of the radiator plate 22.

An epoxy resin adhesive agent having the insulating property is applied to the upper plane of the radiator plate 22, and the frame 21 and the circuit configuration 10 are overlapped on the upper plane of the radiator plate 22 to assemble the circuit configuration 10 to the housing 20. In this instance, a jig (not illustrated) and a pressing machine, etc., are used to press the circuit substrate 11, by which the adhesive agent can be adhered to the lower plane (back plane) of the bus bar 13 and to upper plane (front plane) of the radiator plate 22 to provide an insulating layer (not illustrated) between the bus bar 13 and the radiator plate 22. Further, a screw (not illustrated) is screwed to tighten the radiator plate 22 and the frame 21, by which the radiator plate 22 is fixed to the frame 21. A sealing agent (not illustrated) is applied between the frame 21 and the radiator plate 22 to keep them water-tight.

As explained above, in a stage where the circuit configuration 10 is assembled to the housing 20, of bus bars 13, those arrayed on the lower plane of the circuit substrate 11 are accommodated into the accommodating space 23 of the housing 20. Then, the potting material (not illustrated) is filled into the accommodating space 23 as a water-proof means and the bus bars 13 are buried into the potting material (not illustrated) In addition, the potting material (not illustrated) is filled up to the height of the frame 21 to bury the circuit substrate 11 therein, thereby making it possible to reliably keep the circuit substrate 11 and the bus bars 13 waterproof and insulative.

The cover 30 is assembled to the frame 21 from above, concealing the upper plane of the circuit configuration 10 by the cover 30. Further, a front connector 31 is assembled to the front edge of the cover 30. The front connector 31 is provided with a hood part 32, a terminal 33 is assembled to the bottom wall of the hood part 32 so as to penetrate back and forth the bottom wall, the terminal 33 projected from the back plane of the front connector 31 is bent downward and inserted into an inserting hole 14 fitted on the circuit substrate 11 from above. A land part (not illustrated) is formed at the peripheral border and the inner wall of the inserting hole 14, and the land part (not illustrated) is connected to the terminal 33 by flow soldering. The flow soldering is a soldering in which a melted solder is used to cover the surface of the circuit substrate 11 to be soldered on a solder reservoir (not illustrated) and the melted solder is allowed to enter onto the inserting hole 14 and the terminal 33, thereby soldering the land part (not illustrated) and the terminal 33.

Two tubular fixed parts 35 and 35 are formed in a way of drooping downward from the lower plane of the front connector 31, and the front connector 31 is fixed to the circuit substrate 11 by using a screw 36 penetrated from the lower plane of the circuit substrate 11 to screw and tighten the fixed parts 35 and 35.

For the purpose of preventing an interference of the radiator plate 22 with an edge projected below the circuit substrate 11 of the terminal 33 of the front connector 31 and also preventing an interference of the radiator plate 22 with the screw 36 for fixing the front connector 31 and the circuit substrate 11, a recessed part 50 in which a radiator plate 22 is partially depressed downward is provided at the front of the radiator plate 22 in a way of extending in the longitudinal direction. The recessed part 50 is made deeper than the length of the terminal 33 projected from the circuit substrate 11 and the length of the screw 36 projected from the circuit substrate 11 (refer to FIG. 4 and FIG. 7).

Further, a fuse block 38 is assembled to the rear edge of the cover 30, and a rear connector 39 accommodating the terminal part projected upward from the rear edge of the cover 30 is assembled to the fuse block 38. The electrical connection box 40 of the present embodiment is thus constituted, as described so far.

Figure 3:
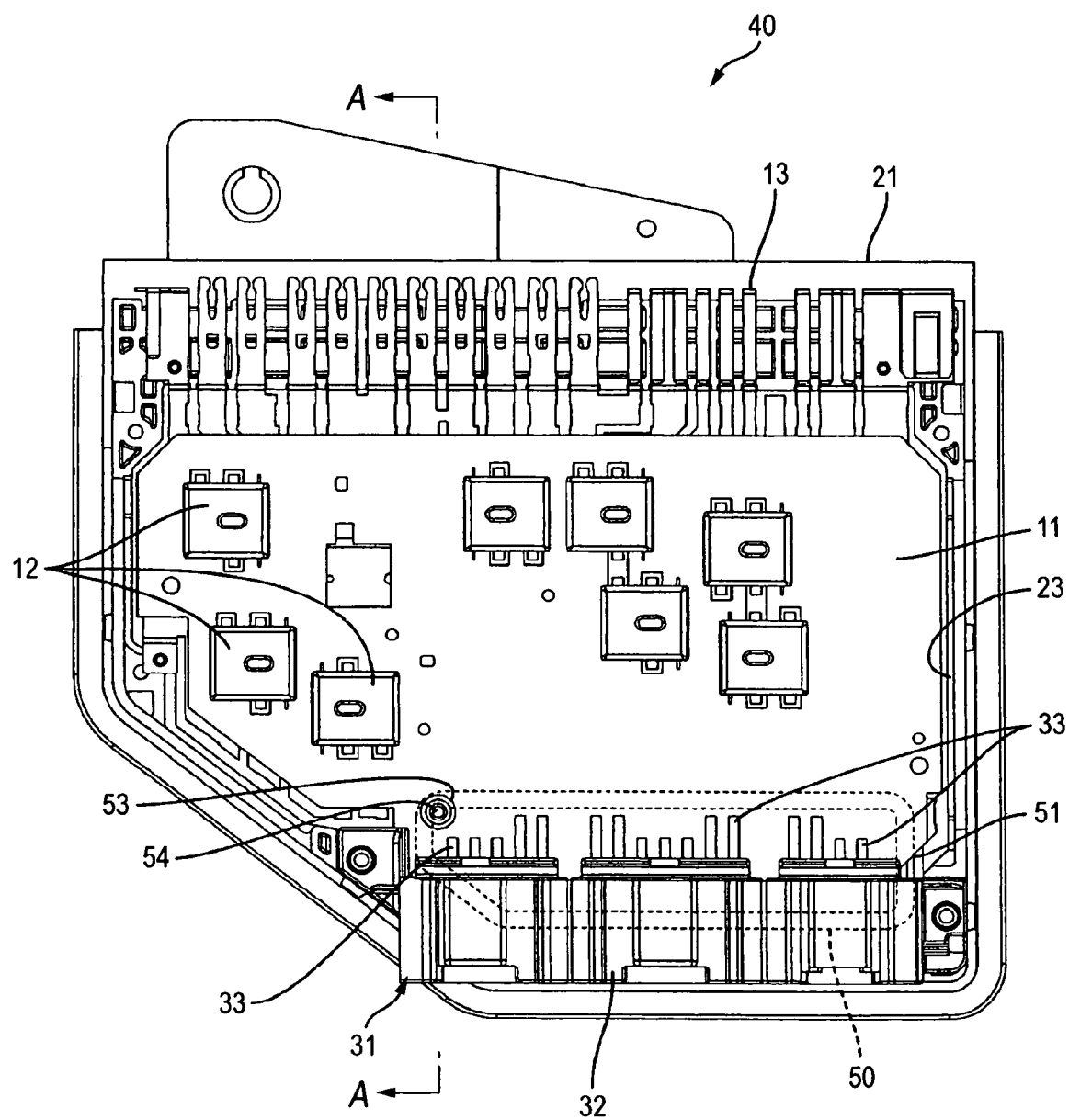
FIG. 3 is a plain view showing a state where the cover of the electrical connection box is removed.
Figure 5:
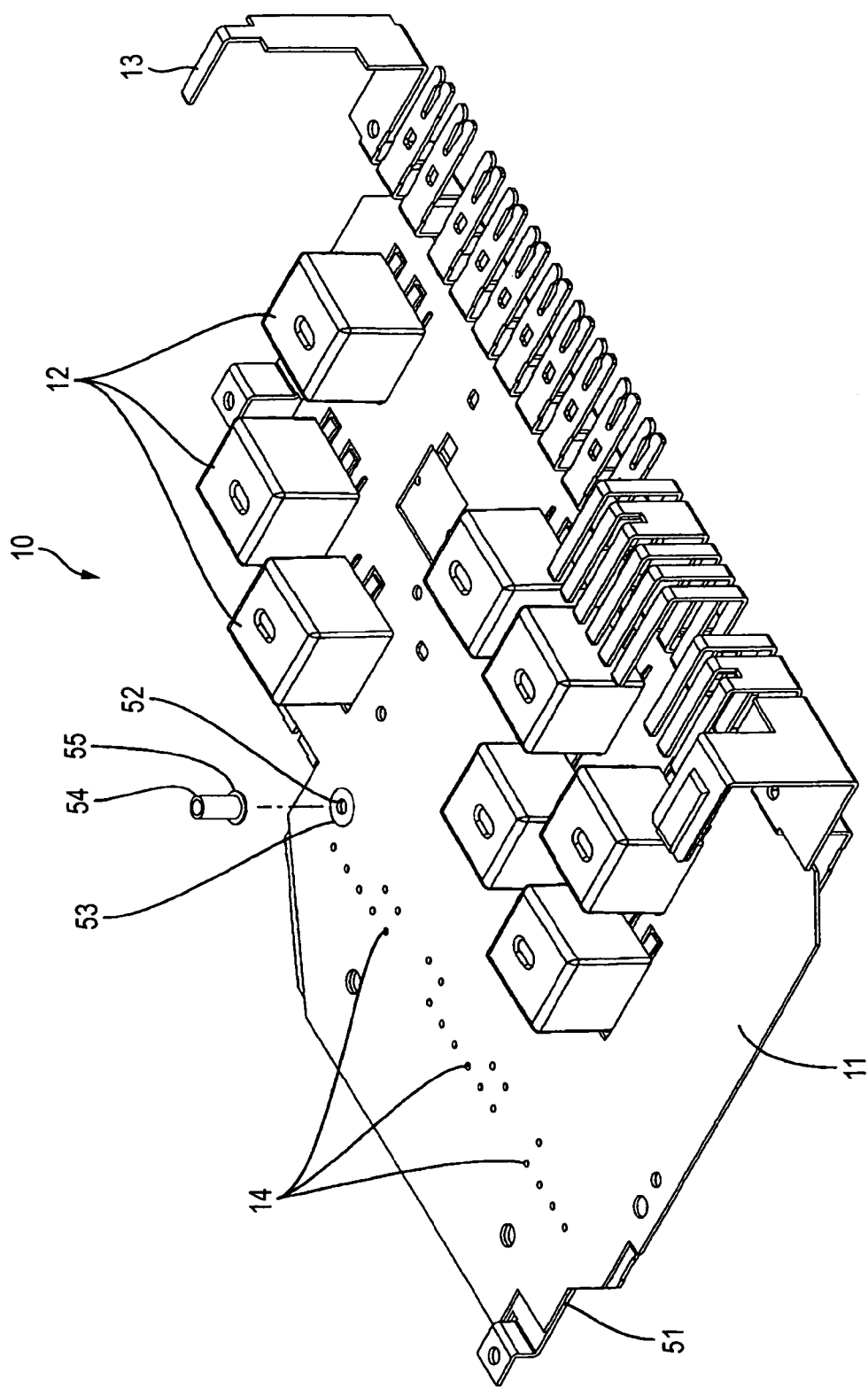
FIG. 5 is a perspective view of the circuit configuration.
Figure 6:
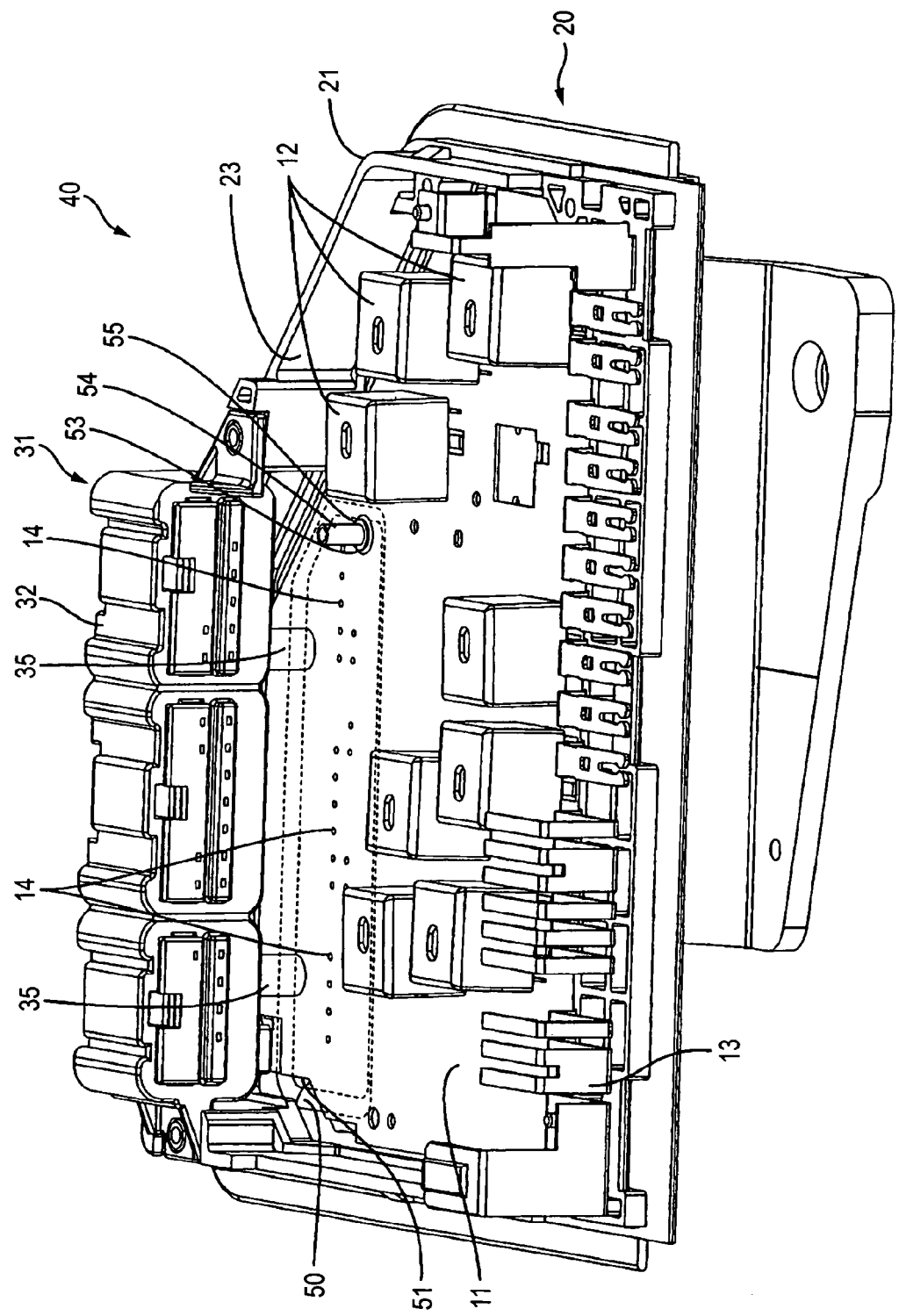
FIG. 6 is a perspective view showing a state where the cover of the electrical connection box is removed.
Figure 7:
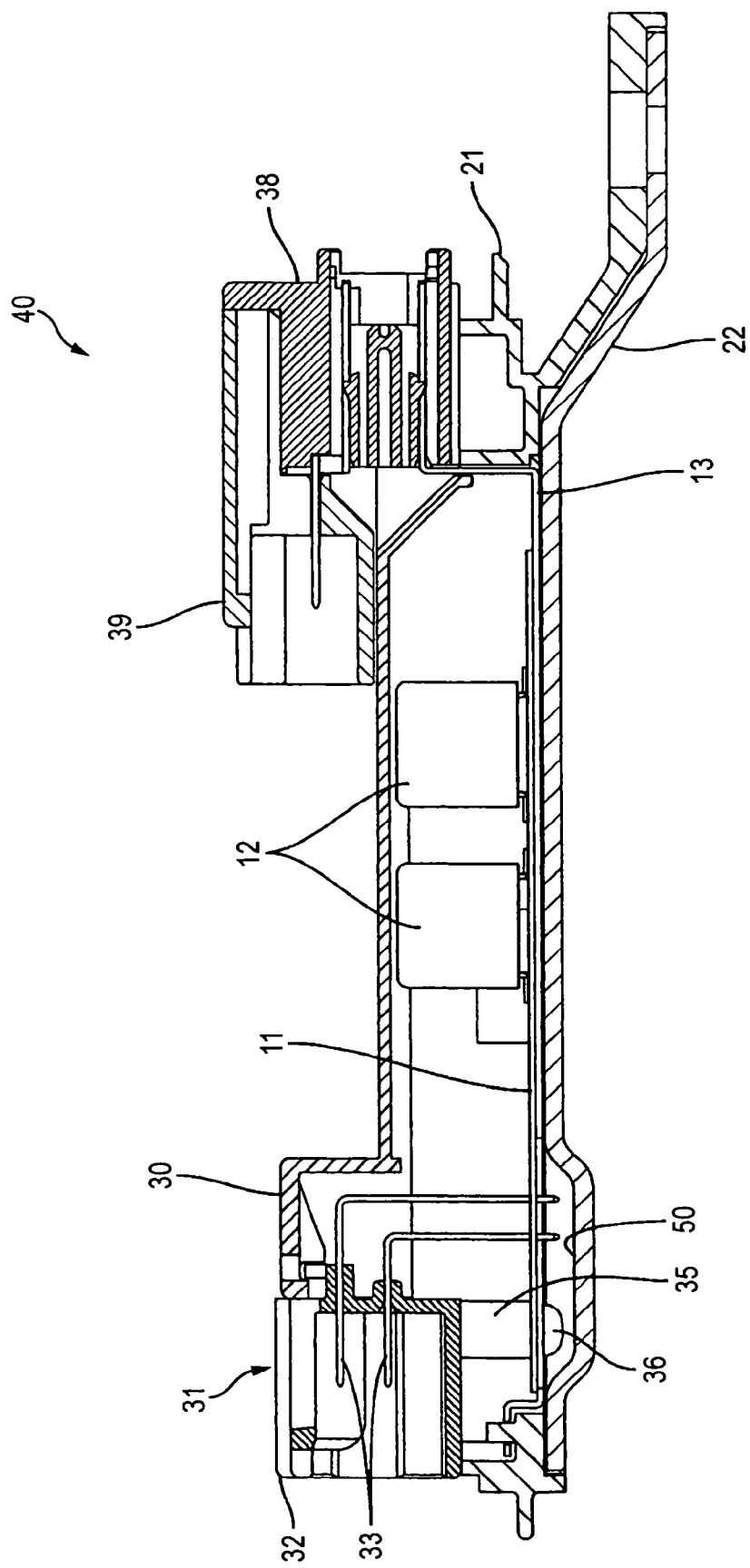
FIG. 7 is a longitudinal sectional view of the electrical connection box.

As shown in FIG. 3 and FIG. 5, a notch is given to the right front edge of the circuit substrate 11 at a position corresponding to the right front edge of the recessed part 50 to form a potting material inflow hole 51. The inside of the recessed part 50 is connected communicatively to the space above the circuit substrate 11 through the potting material inflow hole 51 (refer to FIG. 6).

Further, an air exhaust hole 52 is formed in a way of vertically penetrating the circuit substrate 11 at the left front part of the circuit substrate 11, which is a position corresponding to the left rear edge of the recessed part 50. The air exhaust hole 52 is provided at a position which is furthermost from the potting material inflow hole 51 formed on the right front edge, of positions corresponding to the recessed part 50 (refer to FIG. 3).

Figure 4:
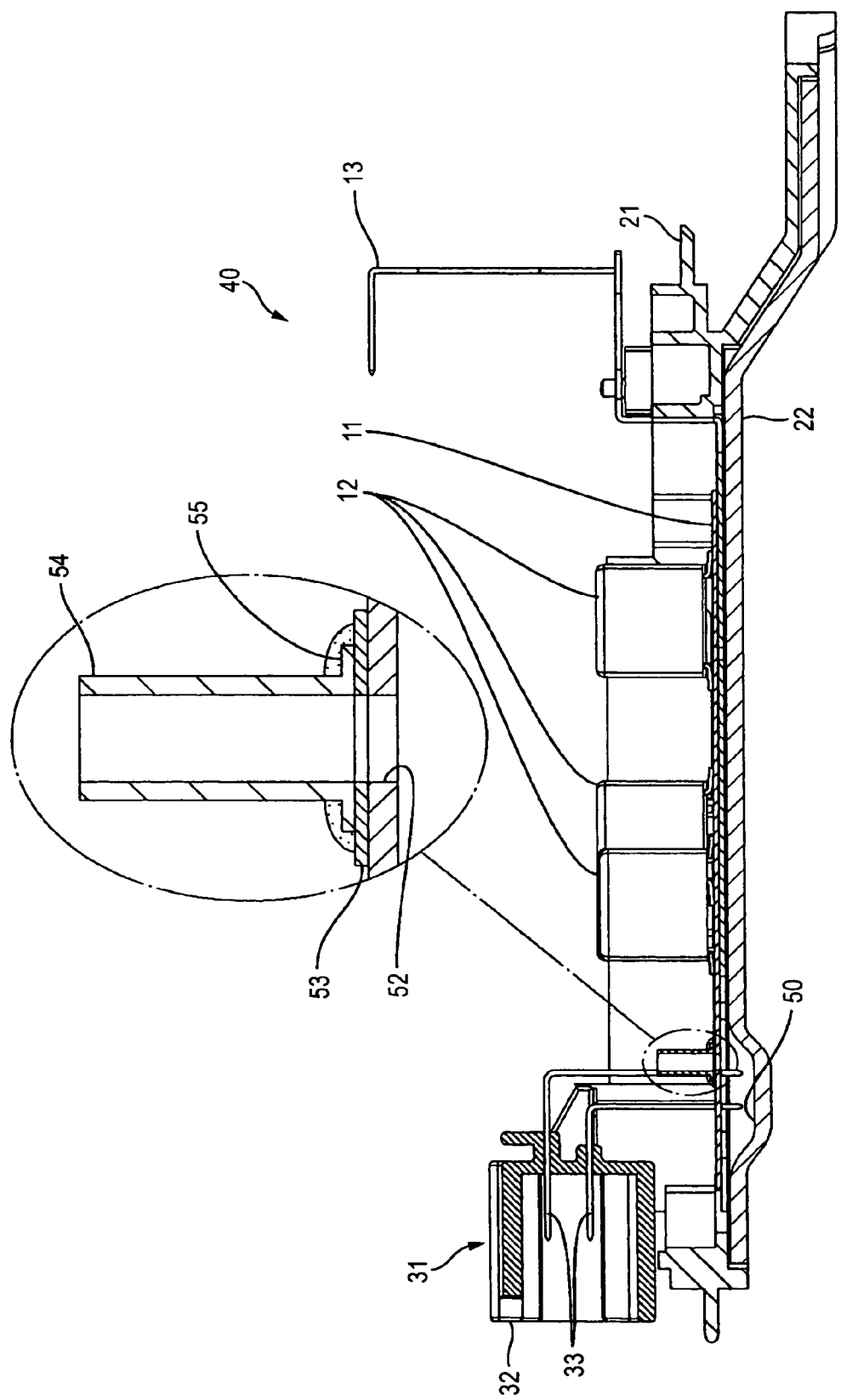
FIG. 4 is a cross sectional view taken along line A—A in FIG. 3.

Then, as shown in FIG. 4 and FIG. 5, a copper-made land part 53 is formed at the peripheral border of the air exhaust hole 52. To the land part 53, a copper-made tubular part 54 erected above from the circuit substrate 11 is attached by re-flow soldering.

A stopper 55 is provided at the lower edge of the tubular part 54, and the stopper 55 is overlapped on the land part 53 and joined by re-flow soldering. An opening edge on the upper edge of the tubular part 54 is formed to be slightly lower than the height of the frame 21 so that it will not interfere with the lower plane of the cover 30. Further, the opening edge of the tubular part 54 is formed at a position higher than the upper plane of the potting material that is filled above the circuit substrate 11 so that it can be connected communicatively to a space above the circuit substrate 11 while the potting material is being filled and after the potting material is filled into the recessed part 50.

Next, a description will be made about the actions and effects of the present embodiment. First, when a liquid-type potting material is injected into the accommodating space 23, the potting material will spread so as to cover on the circuit substrate 11. In this instance, the potting material covering the circuit substrate 11 can flow only in a small quantity into the recessed part 50 through a clearance between the circuit substrate 11 and the radiator plate 22 or others. Then, when the potting material reaches the potting material inflow hole 51 formed at the right edge of the circuit substrate 11, the potting material will flow into the recessed part 50 in a large quantity through the potting material inflow hole 51. The potting material is filled into the recessed part 50, while pushing air inside the recessed part 50 to a position away from the potting material inflow hole 51. The thus pushed air can escape outside the recessed part 50 through the air exhaust hole 52 and the tubular part 54 which are connected communicatively to a space above the circuit substrate 11.

In this instance, since the opening edge of the tubular part 54 is formed at a position higher than the upper plane of the potting material that is filled into the accommodating space 23, it is connected constantly and communicatively to a space above the circuit substrate 11 while the potting material is being filled and after the potting material is filled. Therefore, the potting material can be injected into the recessed part 50 through the potting material inflow hole 51 at the same time while air inside the recessed part 50 is allowed to escape from the air exhaust hole 52 and the tubular part 54, by which the potting material can be quickly filled into the recessed part 50 to improve the filling work efficiency of the potting material.

Further, since the air exhaust hole 52 is provided at a position which is furthermost from the potting material inflow hole 51, of positions corresponding to the recessed part 50, the potting material can be filled, with no air left inside the recessed part 50. Thereafter, the potting material is allowed to cure, thereby reliably keeping the circuit substrate 11, bus bar 13, radiator plate 22 and terminal 33 waterproof and insulative.

Thus, according to the present embodiment, since the potting material can be injected from the potting material inflow hole 51 connected communicatively to the inside of the recessed part 50 and a space above the circuit substrate 11 in a sufficient quantity to fill the potting material into the recessed part 50, air residue is prevented from developing inside the recessed part 50. Therefore, water is prevented from entering into a clearance developed from the air residue to improve the waterproof property. Short circuits which may be caused by water entered or dew drops are also prevented to improve the reliability.

Further, according to the present embodiment, since the opening edge of the tubular part 54 is provided at a position higher than the upper plane of the potting material that is filled, the inside of the recessed part 50 is connected constantly and communicatively to a space above the upper plane of the potting material, while the potting material is being filled and after the potting material is filled. Therefore, air pushed by the potting material can escape from the air exhaust hole 52 and the tubular part 54 according to filling of the potting material into the recessed part 50, thereby making it possible to prevent an air residue from developing inside the recessed part 50. As a result, water is prevented from entering into a clearance provided into the recessed part 50 to improve the waterproof property. Short circuits which may be caused by water entered are also prevented to improve the insulating property.

In addition, according to the present embodiment, the potting material that is injected into the recessed part 50 from the potting material inflow hole 51 is filled into the recessed part 50, while pushing away air inside the recessed part 50. Air is pushed by the potting material to a position which is away from the potting material inflow hole 51. Since the air exhaust hole 52 and the tubular part 54 are formed at a position which is furthermost from the potting material inflow hole 51, air pushed by the potting material will not remain inside the recessed part 50 and can escape from the air exhaust hole 52 and the tubular part 54. As a result, the potting material can be filled into the recessedpart 50 without any clearance, thereby preventing water from entering into the clearance to improve the waterproof property. Short circuits which may be caused by water entered are also prevented to improve the insulating property.

<Embodiment 2>

Embodiment 2 of the present invention will be described by referring to FIG. 8 through FIG. 11. Embodiment 2 is different from Embodiment 1 in that Embodiment 2 the air exhaust hole 52 is provided at a position where the potting material inflow hole 51 is to be provided in Embodiment 1, and in Embodiment 2 the potting material inflow hole 51 is provided at a position where the air exhaust hole 52 is to be provided in Embodiment 1, and the air exhaust hole 52 is not provided for the tubular part 54. The parts which are the same as those of Embodiment 1 are given the same symbols to omit overlapping description.

Figure 8:
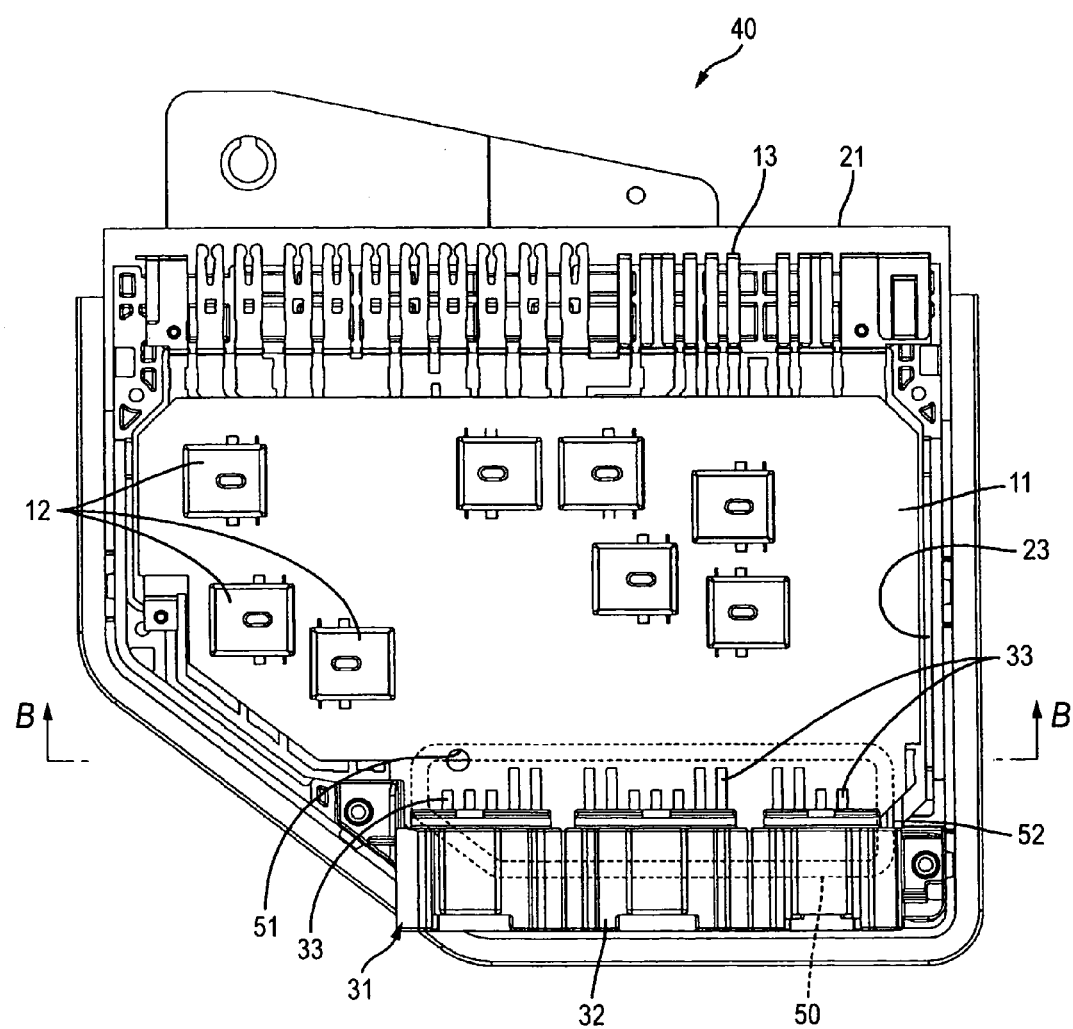
FIG. 8 is a plain view showing a state where the cover of the electrical connection box related to Embodiment 2 of the present invention is removed.

As shown in FIG. 8, a notch is given to the right front edge of the circuit substrate 11 at a position corresponding to the right front edge of the recessed part 50 to form an air exhaust hole 52. The inside of the recessed part 50 is connected communicatively to a space above the circuit substrate 11 through the air exhaust hole 52.

Figure 9:
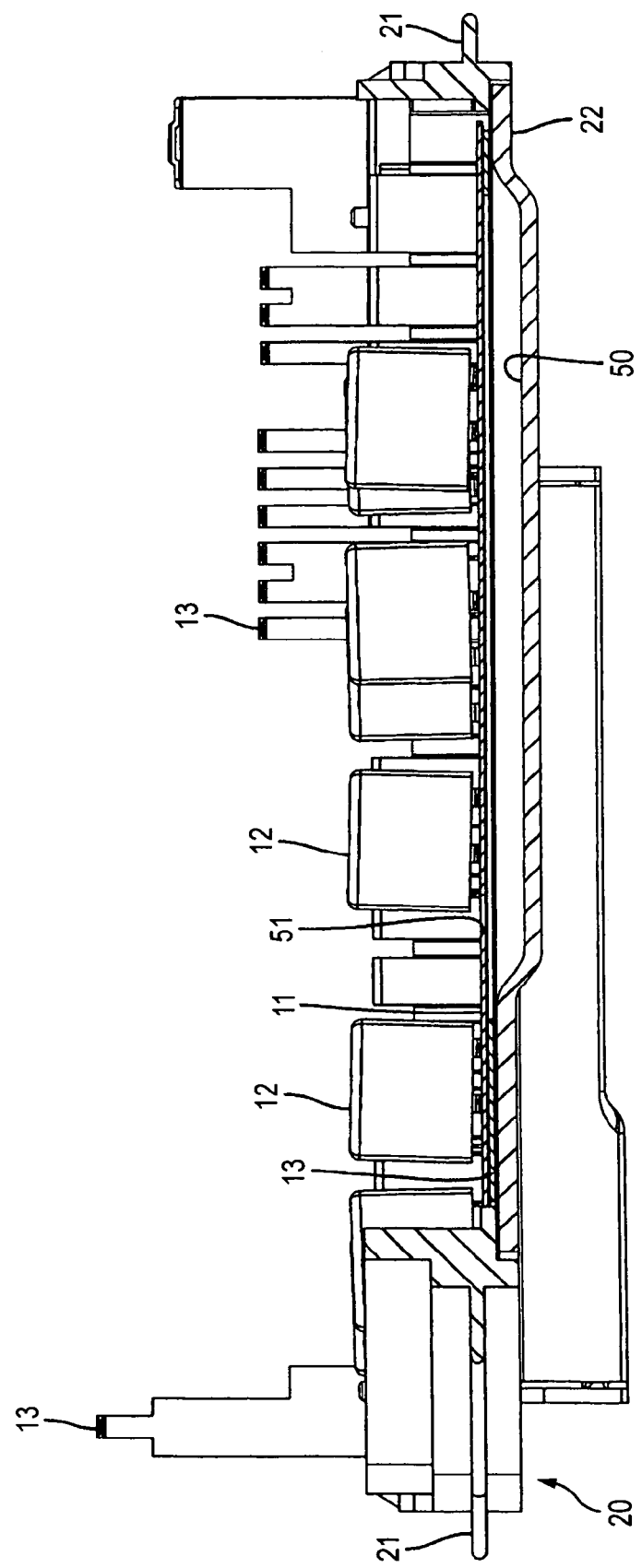
FIG. 9 is a cross sectional view taken along line B—B in FIG. 8.

Further, as shown in FIG. 8 and FIG. 9, the potting material inflow hole 51 is formed by vertically penetrating the circuit substrate 11 at the left front of the circuit substrate 11, which is a position corresponding to the left rear edge of the recessed part 50. The potting material inflow hole 51 is provided at a position which is furthermost from the air exhaust hole 52 formed at the right front edge, of the positions corresponding to the recessed part 50. The potting material inflow hole 51 is made large enough to accommodate the tip of the injection nozzle 60 for allowing the potting material 61 to flow into the recessed part.

Figure 10:
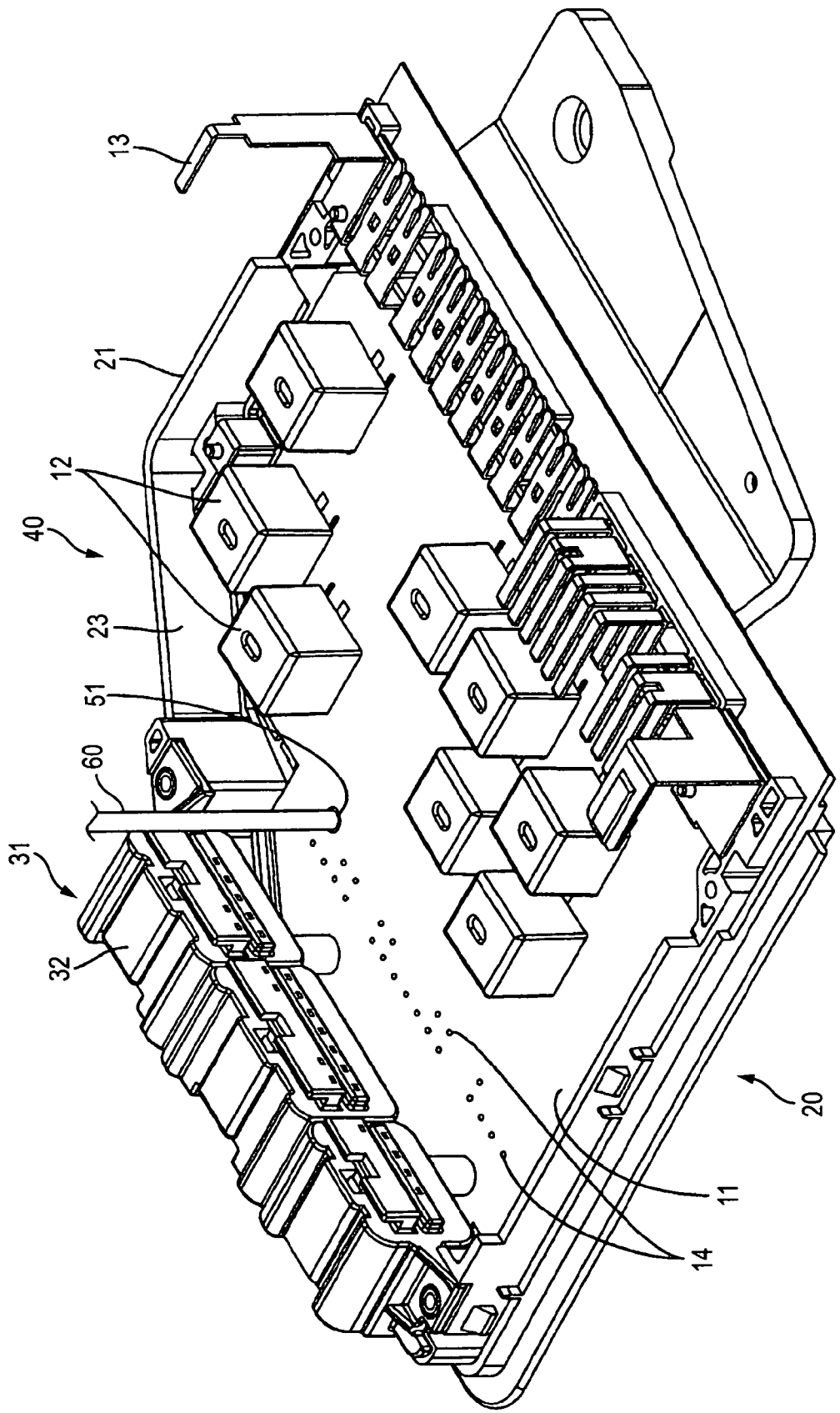
FIG. 10 is a perspective view showing a state where the cover of the electrical connection box is removed and the injection nozzle is inserted into the potting material inflow hole.
Figure 11:
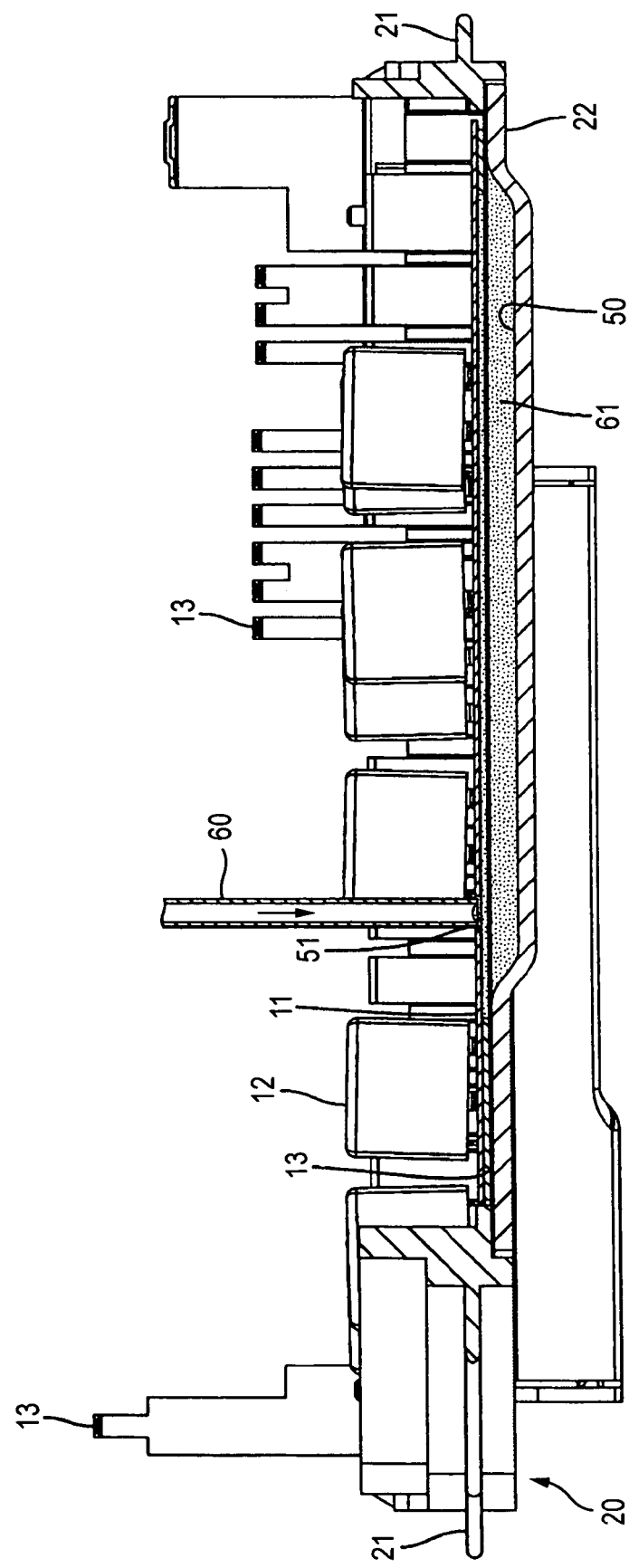
FIG. 11 is a cross section al view taken alone line B—B in a state where the potting material is injected into the recessed part.

Next, a description will be made about the actions and effects of the present embodiment. As shown in FIG. 10 and FIG. 11, the tip of the injection nozzle 60 is inserted into the potting material inflow hole 51 to directly flow the liquid-type potting material 61 into the recessed part 50, with pressure applied. This step makes it possible to fill the potting material 61 into the recessed part 50 without fail.

Thereafter, the potting material 61 is filled into the recessed part 50, while pushing air inside the recessed part 50 to a position which is away from the potting material inflow hole 51. The thus pushed air can escape outside the recessed part 50 from the air exhaust hole 52 connected communicatively to a space above the circuit substrate 11. Since the air exhaust hole 52 is provided at a position which is furthermost from the potting material inflow hole 51, air pushed by the potting material 61 can escape from the air exhaust hole 52, without remaining inside the recessed part 50, thereby preventing an air residue from developing inside the recessed part 50.

When the potting material 61 is filled into the recessed part 50 and begins to overflow from the air exhaust hole 52, the injection nozzle 60 is removed from the potting material inflow hole 51. Then, the injection nozzle 60 is used to flow the potting material 61 into the accommodating space 23 above the circuit substrate 11, by which the potting material 61 is filled into the accommodating space 23 to bury the circuit substrate 11 into the potting material 61. Thus, according to the present embodiment, the injection nozzle 60 is used to fill the potting material 61 into the recessed part 50 and the accommodating space 23, thereby making it possible to improve the filling work efficiency of the potting material 61.

After burial of the circuit substrate 11 into the potting material 61, the potting material 61 is allowed to cure, thereby reliably keeping the circuit substrate 11, bus bar 13, radiator plate 22 and terminal 33 waterproof and insulative.

As described so far, according to the present embodiment, an air residue is prevented from developing inside the recessed part 50. As a result, water is prevented from entering into a clearance provided into the recessed part 50 to improve the waterproof property. Short circuits which may be caused by water entered are also prevented to improve the insulating property.

<Other Embodiments>

The present invention shall not be restricted to the embodiments described by referring to the above description and figures but may include, for example, the following embodiments in the technical field of the present invention. Further, the present invention may be executed in various modifications, within a scope not deviating from the object of the invention.

(1) In Embodiment 1, the circuit substrate 11 is made slightly narrow to provide the potting material inflow hole 51. The present invention shall not be restricted thereto, but a vertically penetrating inserting hole may be formed on the circuit substrate 11 to provide the potting material inflow hole 51.

(2) In Embodiment 1, the tubular part 54 is joined by re-flow soldering in a way of erecting from the circuit substrate 11. The present invention shall not be restricted thereto but an adhesive agent may be used to attach the tubular part 54 to the circuit substrate 11.

(3) In Embodiment 1, the tubular part 54 is made with copper. The present invention shall not be restricted thereto and the tubular part may be made with a metal such as aluminum or stainless steel, other than copper. It may also be made with a synthetic resin such as epoxy resin.

(4) In Embodiment 1, the terminal 33 is constituted so as to be accommodated into the recessed part 50. The present invention shall not be restricted thereto and may be constituted in such a way that electrical elements arrayed on the lower plane of the circuit substrate 11 are accommodated into the recessed part.

(5) In Embodiment 1, the electrical connection box is provided with the potting material inflow hole 51, the air exhaust hole 52 and the housing 54. The present invention shall not be restricted thereto. If a clearance between the circuit substrate 11 and the radiator plate 22 is large enough, air pushed by the potting material can escape from the clearance to eliminate the air exhaust hole 52 and the tubular part 54. Further, if, for example, the potting material inflow hole 51 is made large enough, the potting material is flowed into the recessed part 50 from the potting material inflow hole 51 at the same time while air can escape from the recessed part 50, thereby eliminating the air exhaust hole 52 and the tubular part 54 also in this case.

(6) In Embodiment 1, the electrical connection box is provided with the potting material inflow hole 51, the air exhaust hole 52 and the tubular part 54. The present invention shall not be restricted thereto. If, for example, a clearance between the circuit substrate 11 and the radiatorplate 22 is large enough, the potting material can be flowed from the clearance into the recessed part 50 in a quantity sufficient to fill the recessed part 50, thereby eliminating the potting material inflow hole 51. Further, for example, lowering the viscosity of the potting material makes it possible to flow the potting material into the recessedpart 50 in a quantity sufficient to fill the recessed part 50 even from the clearance between the circuit substrate 11 and the radiator plate 22, thereby also eliminating the potting material inflow hole 51.

(7) In the present embodiment, the air exhaust hole 52 is provided at a position which is furthermost from the potting material inflow hole 51 out of the recessed part 50. The present invention shall not be restricted thereto, and the air exhaust hole 52 and the potting material inflow hole 51 may be respectively provided at a position corresponding to the recessed part 50, or at a position connected communicatively to the recessed part 50 and a space above the circuit substrate 11.

(8) In Embodiment 1, the tubular part 54 is in a cylindrical form with a round cross section. The present invention shall not be restricted thereto, and it may be in a cylindrical form with the cross section of a polygon such as a triangle, a rectangle or the cross section of an oval and ellipse.

(9) In the present embodiment, the housing 20 is made up of two parts, namely, the frame 21 and the radiator plate 22. The present invention shall not be restricted thereto, and the housing 20 may be a one-piece part in which the frame 21 is joined with the radiator plate 22 in an integrated form.

(10) In Embodiment 2, the electrical connection box is provided with the potting material inflow hole 51 and the air exhaust hole 52. The present invention shall not be restricted thereto. If, for example, a clearance between the circuit substrate 11 and the radiator plate 22 is large enough, the potting material can be flowed from the clearance into the recessed part 50 in a quantity sufficient to fill the recessed part 50, thereby eliminating the potting material inflow hole 51. Further, for example, lowering the viscosity of the potting material makes it possible to flow the potting material into the recessed part 50 in a quantity sufficient to fill the recessed part 50 even from the clearance between the circuit substrate 11 and the radiator plate 22, thereby also eliminating the potting material inflow hole 51.

What is claimed is:

1. An electrical connection box comprising:
   a housing having a bottom plane with a recessed part at which the bottom plane is at least partially depressed;
   a circuit substrate accommodated into the housing to be at least partially overlapped on the bottom plane, the circuit substrate having a hole connectable to an inside of the recessed part of the housing and a space above the circuit substrate; and
   a potting material filled so that the circuit substrate can be buried into the housing,
   wherein the hole is formed at a position corresponding to the recessed part of the housing.

2. An electrical connection box according to claim 1, wherein the hole is an air exhaust hole.

3. An electrical connection box according to claim 2, wherein a tubular part opened at a position higher than an upper plane of the potting material which is filled into the housing is connected to the air exhaust hole.

4. An electrical connection box according to claim 1, wherein the hole is a potting material inflow hole.

5. An electrical connection box according to claim 4, wherein an air exhaust hole connectable to the inside of the recessed part and a space above the circuit substrate is formed at a position corresponding to the recessed part on the circuit substrate.

6. An electrical connection box according to claim 5, wherein a tubular part opened at a position higher than an upper plane of the potting material which is filled into the housing is communicatively connected to the air exhaust hole.

7. An electrical connection box according to claim 5, wherein the air exhaust hole is provided at a position furthermost from the potting material inflow hole at a position corresponding to the recessed part.

8. A method for manufacturing an electrical connection box according to claim 4, comprising:
   inserting an injection nozzle of the potting material into the potting material inflow hole; and
   filing the potting material into the recessed part.

9. A method for manufacturing an electrical connection box according to claim 8, further comprising:
   filling the potting material into the recessed part;
   removing the injection nozzle from the potting material inflow hole;
   feeding the potting material from the injection nozzle into the housing; and
   burring the circuit substrate into the potting material.

* * * * *

UNITED STATES PATENT AND TRADEMARK OFFICE
CERTIFICATE OF CORRECTION

PATENT NO. : 7,014,478 B2 Page 1 of 1
APPLICATION NO. : 11/131423
DATED : March 21, 2006
INVENTOR(S) : Kouji Yamashita et al.

It is certified that error appears in the above-identified patent and that said Letters Patent is hereby corrected as shown below:

Item No. 75. (Inventors), change "Takayuki Tomita" to --Takayuki Tomida--

Signed and Sealed this

Twenty-ninth Day of August, 2006

JON W. DUDAS
*Director of the United States Patent and Trademark Office*